(12) United States Patent
Lee et al.

(10) Patent No.: US 8,947,146 B2
(45) Date of Patent: Feb. 3, 2015

(54) PULSE-BASED FLIP FLOP

(71) Applicant: National Chiao Tung University, Hsinchu (TW)

(72) Inventors: Chen-Yi Lee, Hsinchu (TW); Wei-Hao Sung, Kaohsiung (TW); Ming-Che Lee, Taoyuan County (TW)

(73) Assignee: National Chiao Tung University, Hsinchu (TW)

( * ) Notice: Subject to any disclaimer, the term of this patent is extended or adjusted under 35 U.S.C. 154(b) by 57 days.

(21) Appl. No.: 13/853,064

(22) Filed: Mar. 29, 2013

(65) Prior Publication Data

US 2014/0152363 A1 Jun. 5, 2014

(30) Foreign Application Priority Data

Nov. 30, 2012 (TW) .............................. 101145081 A

(51) Int. Cl.
*H03K 3/356* (2006.01)
*H03K 3/012* (2006.01)

(52) U.S. Cl.
CPC .......... *H03K 3/012* (2013.01); *H03K 3/356173* (2013.01)
USPC ........................................................ 327/211

(58) Field of Classification Search
USPC ................................................ 327/199–223
See application file for complete search history.

(56) References Cited

U.S. PATENT DOCUMENTS

| | | | |
|---|---|---|---|
| 6,075,748 A * | 6/2000 | Bhullar | .................... 365/230.08 |
| 6,181,180 B1 | 1/2001 | Chen et al. | |
| 6,501,315 B1 | 12/2002 | Nguyen | |
| 7,237,164 B1 * | 6/2007 | Katchmart | .................... 714/726 |
| 7,961,024 B1 | 6/2011 | Lin et al. | |

OTHER PUBLICATIONS

C. K. Teh, T. Fujita, H. Hara, and M. Hamada, "A 77% Energy-Saving 22-Transistor Single-Phase-Clocking D-Flip-Flop with Adaptive-Coupling Configuration in 40nm CMOS," in IEEE Int. Solid-State Circuits Conf. Dig. Tech. Papers (ISSCC), pp. 338-340, Feb. 2011.
B. Kong, S. Kim, and Y. Jun, "Conditional-capture flip-flop for statistical power reduction," IEEE J. Solid-State Circuits, vol. 36, No. 8, pp. 1263-1271, Sep. 2001.
N. Nedovic, "Dynamic flip-flop with improved power," in Proc. European Solid-State Circuits Conference (ESSCIRC), pp. 376-379, Sep. 2000.

* cited by examiner

*Primary Examiner* — Sibin Chen
(74) *Attorney, Agent, or Firm* — CKC & Partners Co., Ltd.

(57) ABSTRACT

A pulse-based flip-flop that latches a data input signal to convert the data input signal into a data output signal in response to a first clock signal and the second clock signal. The pulse-based flip-flop includes a pulse generator and a data latch. The pulse generator includes a first inverter and a signal delay circuit to receive the first clock signal and generate the second clock signal; the data latch includes a delivery circuit, a latch circuit and a control circuit. The data latch is used to latch the data input signal and output the data output signal in response to the first and the second clock signals.

11 Claims, 5 Drawing Sheets

PULSE-BASED FLIP FLOP

RELATED APPLICATIONS

This application claims priority to Taiwan Application Serial Number 101145081, filed Nov. 30, 2012, which is herein incorporated by reference.

BACKGROUND

1. Field of Invention

The present invention relates to a flip flop (FF), particularly a pulse-based flip flop.

2. Description of Related Art

In recent years, due to the widespread availability of various mobile devices and consumer electronic products (e.g. smart-phones, digital cameras, laptops and medical use sensing systems, etc.), the design of electronic products tends to attain the design trend of low power, low working voltage, and low power leakage.

A Flip-flop (FF) is a circuit element which stores data by triggering the edge of the clock signal. The flip-flop is a high power consuming and high power leakage circuit element in that it takes around 40% to 60% of overall dynamic power consumption and power leakage of an overall system.

A pulse-based flip flop comprises a pulse generator and a data latch. Upon designing a pulse-based flip flop, dynamic power consumption is usually the only factor to be concerned while power leakage and operating voltage are not concurrently reduced. For instance, a pulse-based flip flop designed with a dynamic circuit, a domino circuit and a pre-charged circuit could hardly operate in a correct logic under a low operating voltage.

Furthermore, most data latches in the pulse-based flip flop are designed to have two inverters mutually connected, i.e., an output terminal of an inverter connected to an input terminal of the other inverter, such that current-conflicts may easily occur in data writing.

Therefore, it is necessary to design a pulse-based flip flop with low power consumption, low operating voltage and power leakage, and capable of avoiding current-conflicts.

SUMMARY

An aspect of the present invention is to provide a pulse-based flip flop, taking the advantage of the design of a control circuit of a data latch inside of the pulse-based flip flop to cut off the path of the direct current in the data latch in order to reduce the power consumption and power leakage.

An embodiment of the present invention relates to a pulse-based flip flop. The pulse-based flip flop latches a data input signal in response to a first clock signal and a second clock signal to convert the data input signal to a data output signal. The pulse-based flip flop includes a pulse generator and a data latch. The pulse generator is configured for receiving a first clock signal and generating a second clock signal, in which the pulse generator includes a first inverter and a signal delay circuit. The first inverter is configured for receiving the first clock signal and outputting the second clock signal; the signal delay circuit is electrically connected to the first inverter, configured for receiving the second clock signal and delaying the second clock signal. The data latch is configured for latching the data input signal and outputting the data output signal in response to the first clock signal and the second clock signal, in which the data latch includes a delay circuit, a latch circuit and a control circuit. The delivery circuit is configured for delivering the data input signal; the latch circuit is electrically connected to the delivery circuit, configured for receiving and latching the data input signal and outputting the data output signal; and the control circuit is electrically connected to the latch circuit, configured for providing voltage to control the on and off of the latch circuit.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
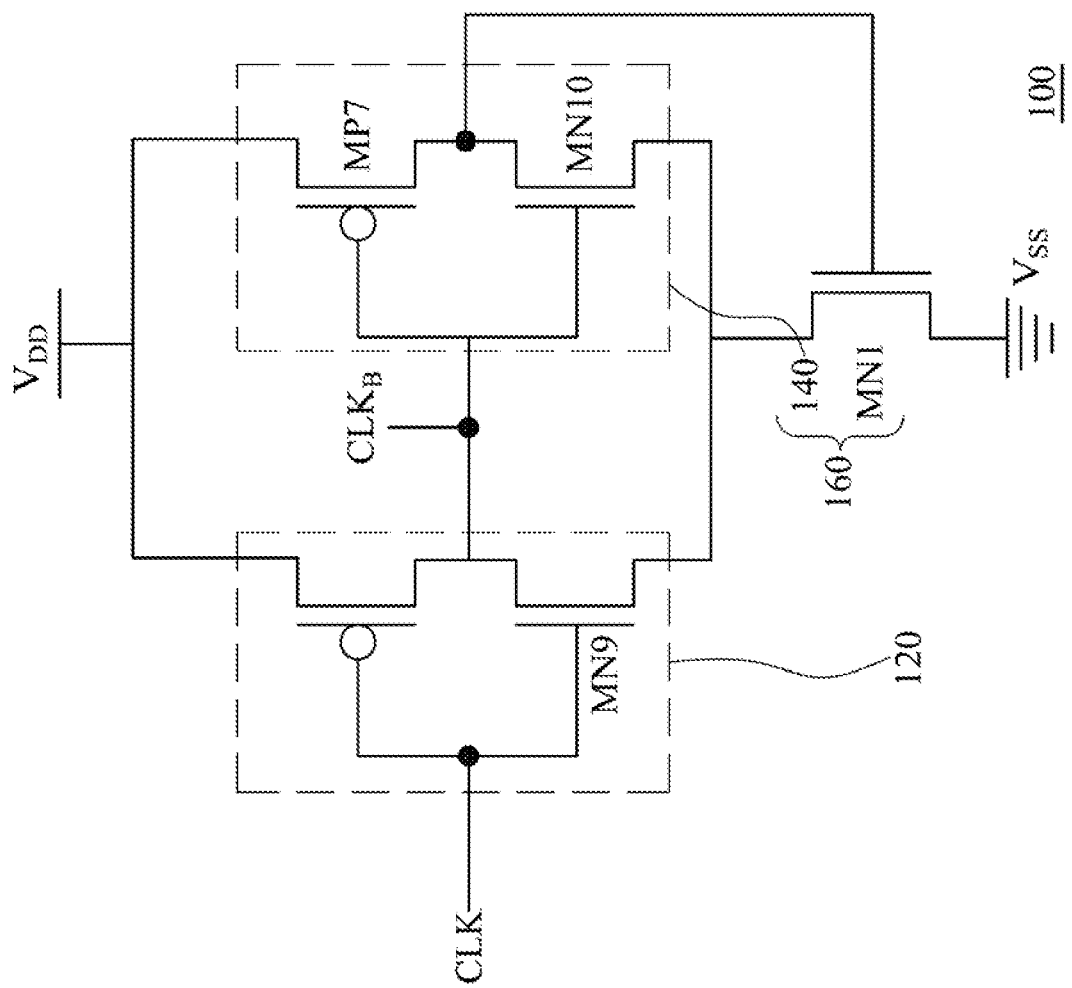
FIG. 1 illustrates a circuit diagram of a pulse generator according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As used herein, "around", "about" or "approximately" shall generally mean within 20 percent, preferably within 10 percent, and more preferably within 5 percent of a given value or range. Numerical quantities given herein are approximate; meaning that the term "around", "about" or "approximately" can be inferred if not expressly stated.

The following embodiment of the invention discloses a pulse-based flip flop which reduces power leakage by a method of stacking transistors, therefore resulting in extremely low dynamic power consumption. The pulse-based flip flop is also designed as a static circuit to be used in a low-voltage operating environment.

The pulse-based flip flop includes a pulse generator and a data latch. The pulse-based flip flop latches a data input signal D and converts the data input signal D to a data output signal Q in response to a first clock signal CLK and a second clock signal CLKB. Specific illustrations will be provided for the pulse generation and the data latch hereafter.

FIG. 1 illustrates a circuit diagram of a pulse generator according to an embodiment of the present invention. A pulse generator 100 includes a first inverter 120 and a signal delay circuit 160, which is used to receive the first clock signal CLK and generate the second clock signal CLKB, in which the phase of the second clock signal CLKB is the inverse of the phase of the first clock signal CLK. The first inverter 120 further includes a ninth NMOS transistor MN9, and the first inverter 120 is used to receive the first clock signal CLK and output the second clock signal CLKB. The signal delay circuit 160 is electrically connected to the first inverter 120 and used to receive the second clock signal CLKB and delay the second clock signal CLKB.

The delay circuit 160 includes a second inverter 140 and a first NMOS transistor MN1, in which the second inverter 140 includes a tenth NMOS transistor MN10 and a seventh PMOS transistor MP7. The second inverter 140 is electrically connected to the first inverter 120 and used to receive the second clock signal CLKB, and the gate of the first NMOS transistor MN1 is electrically connected to the output terminal of the second inverter 140. The transistor MN1 is used to delay the second clock signal CLKB with the second inverter 140 concurrently.

Figure 2:
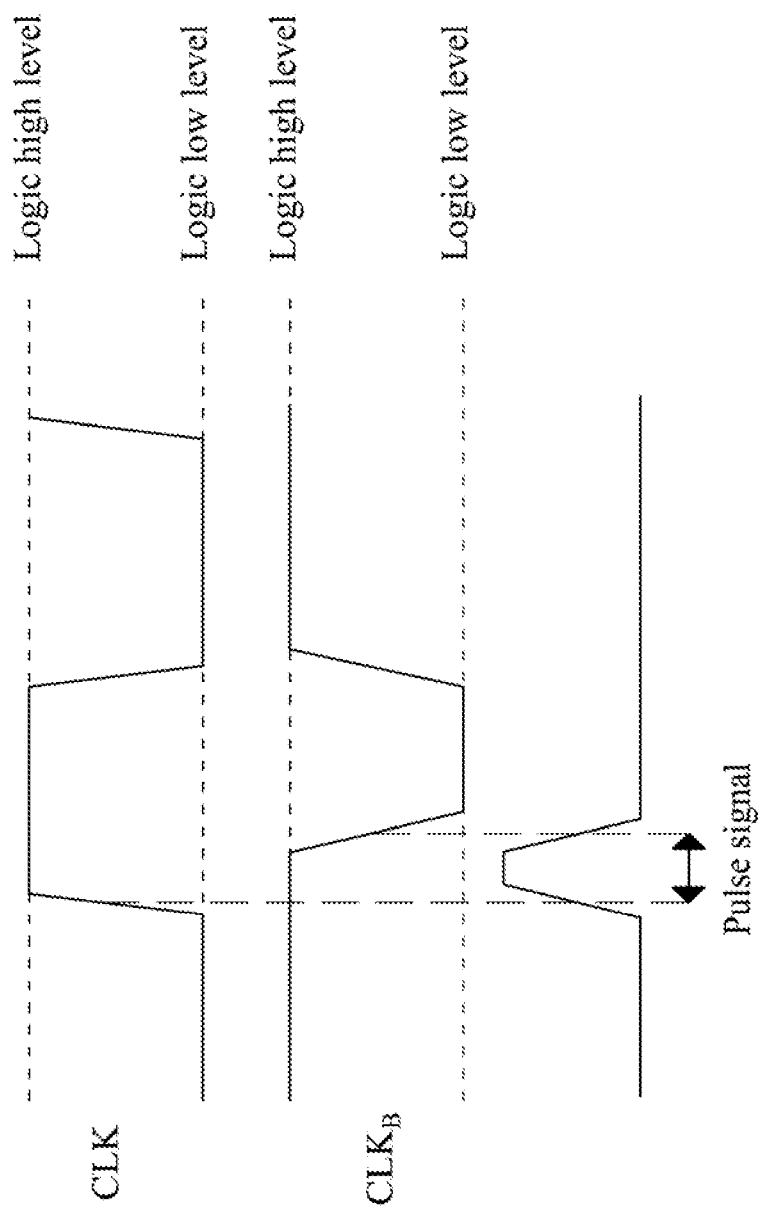
FIG. 2 illustrates a waveform diagram of a clock signal according to an embodiment of the present invention.

As for the aforementioned description, the pulse generator is capable of receiving the first clock signal CLK and generating the delayed and inverted second clock signal CLKB. Please refer to FIG. 1 and FIG. 2 for convenient illustration. FIG. 2 illustrates a waveform diagram of a clock signal according to an embodiment of the present invention.

According to FIG. 2, the first clock signal CLK is originally at logic low level and then received by the first inverter 120 as shown in FIG. 1 to generate the second clock signal CLKB at logic high level, which changes the transistor MN10 inside the second inverter 140 to a conducting state. Since the drain of the transistor MN10 and the gate of the transistor MN1 are connected, the transistor MN1 is at an off state at this time. When the first clock signal CLK is positively edge-triggered and is in transition from logic low level to logic high level, the second clock signal CLKB should have been transferred from logic high level to logic low level, but the timing of the second clock signal CLKB being transferred to logical low level is delayed due to the concurrence of the second inverter 140 and the transistor MN1.

More specifically, when the first clock signal CLK is positively edge-triggered and is in transition from logic low level to logic high level, the transistor MN9 in the first inverter 120 is switched from an off state to a conducting state. At this time, the transistor MN1 is not in a conducting state, which causes the second clock signal CLKB to charge the drain of the transistor MN1 during the discharging process and raises the electric potential of the transistor MN1. It leads to a result of narrowing down the current passing through the transistor MN9 so that the second clock signal CLKB transfers to logic low level slowly. According to the slow speed of transforming to logic low level of the second clock signal CLKB, the charging speed from the power supply potential VDD to the transistor MP7 in the inverter 140 is slow. Furthermore, the connection between the drain of the transistor MP7 and the gate of the transistor MN1 delays the timing of the transistor MN7 to be conductible, and thus delays the timing of the second clock signal CLKB being transferred to logic low level.

As shown in FIG. 2, when the first clock signal CLK and the second clock signal CLKB are both at logic high level, they can be considered as a pulse signal to control the data latch behind. A more specific description will be illustrated hereafter.

Figure 3:
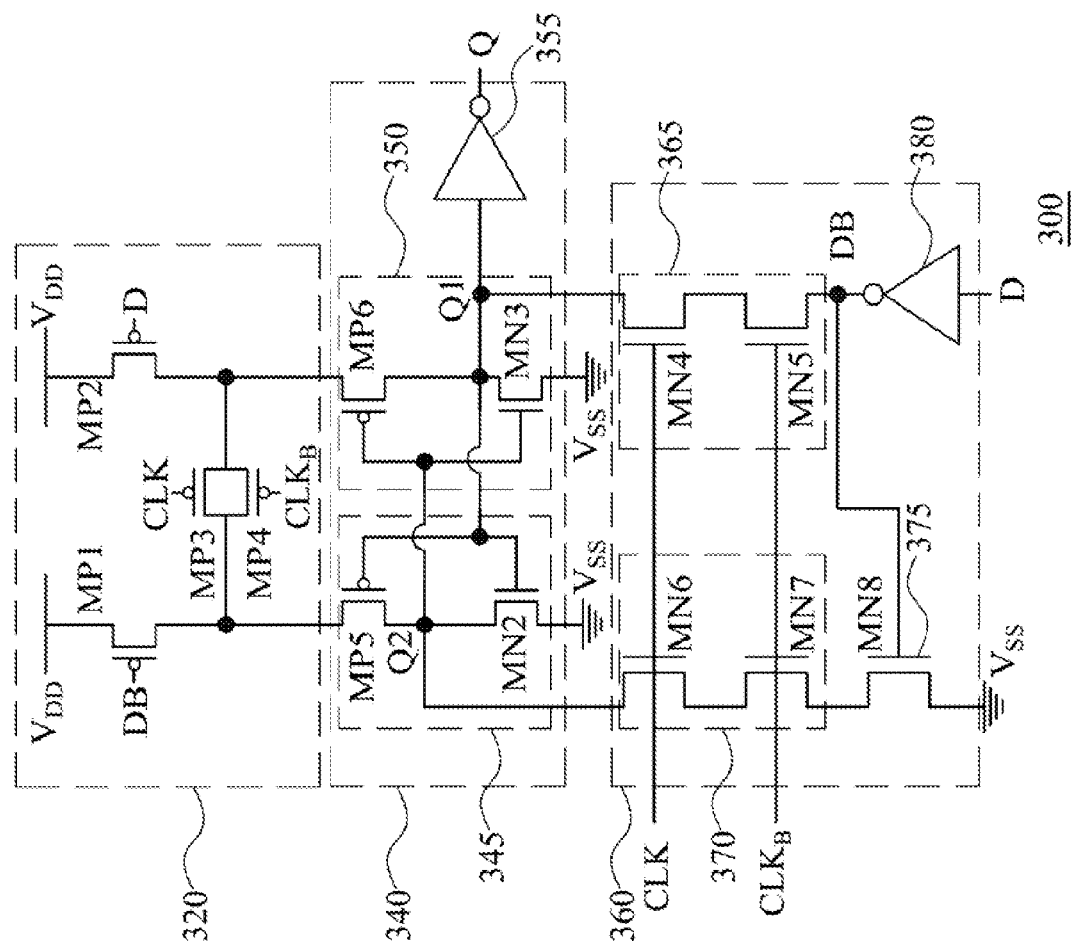
FIG. 3 illustrates a circuit diagram of a data latch according to an embodiment of the present invention.

FIG. 3 illustrates a circuit diagram of a data latch according to an embodiment of the present invention. A data latch 300 is used to latch the data input signal D and output the data output signal Q in response to the first clock signal CLK and the second clock signal CLKB, in which the data latch 300 includes a delivery circuit 360, a latch circuit 340 and a control circuit 320. The delivery circuit 360 is used to deliver the data input signal D, and the latch circuit 340 is electrically connected to the delivery circuit 360, used to receive and latch the data input signal D and output the data output signal Q. The control circuit 320 is electrically connected to the latch circuit 340, used to provide voltage to control the on and off state of the latch circuit 340.

When the data input signal D is inputted into the data latch 300, the control circuit 320 controls the latch circuit 340 to block all the charging current paths to avoid current consumption while the data input signal D is being inputted into the data latch 300. More specific descriptions are provided hereafter.

As shown in FIG. 3, the control circuit 320 includes a first, second third and fourth. PMOS transistors MP1, MP2, MP3 and MP4. The gate of the first PMOS transistor MP1 is used to receive an inverted data input signal DB, which is the inverse of the data input signal D, and the source of the transistor MP1 is electrically connected to the power supply potential VDD. The gate of the second PMOS transistor MP2 is used to receive the data input signal D, and the source of the transistor MP2 is electrically connected to the power supply potential VDD.

The gate of the third PMOS transistor MP3 is used to receive the first clock signal CLK, in which the source of the transistor MP3 is electrically connected to the drain of the transistor MP1 or the drain of the transistor MP2, and the drain of the transistor MP3 is electrically connected to the drain of the transistor MP2 or the drain of the transistor MP1. The gate of the fourth PMOS transistor MP4 is used to receive the second clock signal CLKB, in which the source of the transistor MP4 is electrically connected to the source of the transistor MP3, and the drain of the transistor MP4 is electrically connected to the drain of the transistor MP3.

Next, the latch circuit 340 includes a third inverter 345, a fourth inverter 350 and a fifth inverter 355. The input terminal of the third inverter 345 is electrically connected to a first node Q1, and the output terminal of the third inverter 345 is electrically connected to a second node Q2. The fourth inverter 350 and the third inverter 345 are mutually connected, i.e. the input terminal of the fourth inverter 350 is electrically connected to the second node Q2, and its output terminal is electrically connected to the first node Q1. The input terminal of the fifth inverter 355 is electrically connected to the first node Q1, and its output terminal is used to output the data output signal Q.

The third inverter 345 includes a fifth PMOS transistor MP5 and a second NMOS transistor MN2. The fifth PMOS transistor MP5 is series-connected to the transistor MP1 in the control circuit 320, and the second NMOS transistor MN2 is series-connected to the transistor MP5, and the gate of the transistor MN2 is electrically connected to the gate of the transistor MP5, and the source of the transistor MN2 is connected to the ground potential VSS. Moreover, the fourth inverter 350 includes a sixth PMOS transistor MP6 and a third NMOS transistor MN3. The sixth PMOS transistor MP6 is series-connected to the transistor MP2 in the control circuit 320, and the third NMOS transistor MN3 is series-connected to the transistor MP6, and the gate of the transistor MN3 is electrically connected to the gate of the transistor MP6, and the source of the transistor MN3 is connected to the ground potential VSS.

The delivery circuit 360 includes a first switch element 365, a second switch element 370, a third switch element 375 and a sixth inverter 380. The first switch element 365 is electrically connected to the first node Q1 and switches on when the first clock signal CLK and the second clock signal CLKB are both at logic high level; the second switch element 370 is electrically connected to the second node Q2 and also switches on when the first clock signal CLK and the second clock signal CLKB are both at logic high level. The third switch element 375 is electrically coupled to the second switch element 370, the output terminal of the sixth inverter 380 and the ground potential VSS, switching on when the data input signal D is at logic low level. The input terminal of the sixth inverter 380 is used to receive the data input signal D, and the output terminal of the sixth inverter 380 is electrically connected to the first switch element 365.

More specifically, the first switch element 365 includes a fourth NMOS transistor MN4 and a fifth NMOS transistor MN5, in which the gate of the transistor MN4 is used to receive the first clock CLK, and the gate of the transistor MN5 is used to receive the second clock signal CLKB. The second switch element 370 includes a sixth NMOS transistor MN6 and a seventh NMOS transistor MN7, in which the gate of the transistor MN6 is used to receive the first clock signal CLK, and the gate of the transistor MN7 is used to receive the second clock signal CLKB. The third switch element 375 can be a eighth NMOS transistor MN8, and the gate of the transistor MN8 is used to receive the inverted data input signal DB outputted from the output terminal of the sixth inverter 380.

When the first clock signal CLK and the second clock signal. CLKB are both at logic high level and the data input signal D is also at logic high level, the first switch element 365 and the second switch element 370 are conductible, while the third switch element 375 is controlled to switch off by the inverted data input signal DB at logic low level. Since the first switch element 365 is conductible, the voltage level of the first node Q1 equals to the voltage level of the output terminal of the sixth inverter 380, and the data input signal D is currently at logic high level, so that the voltage level of the output terminal of the sixth inverter 380 is at logic low level, and the voltage level of the first node Q1 is also at logic low level.

Regarding to the control circuit 320, the transistor MP1, MP2, MP3 and MP4 are controlled by the inverted data input signal DB, the data input signal D, the first clock signal CLK and the second clock signal CLKB, respectively. Therefore, when the first clock CLK and the second clock. CLKB are both at logic high level and the data input signal D is also at logic high level, the transistor MP1 is conductible, but the transistor MP2, MP3 and MP4 are broken.

Please refer to FIG. 3, when the transistor MP1 and MP5 are controlled to switch on by the inverted data input signal DB and the first node Q1, the second node Q2 is transferred to logic high level due to the current path formed from the power supply potential VDD to the transistor MP1 and MP5, and then switches MN3 on. Therefore, the transistor MP1, MP5 and MN3 is currently in a conducting state without any direct current (DC) from the power supply potential VDD to the ground electric potential VSS. The data input signal D at logic high level is outputted as a data output signal Q at logic high level from the output terminal of the fifth inverter 355 through the sixth inverter 380, the first switch element 365 and the fifth inverter 355.

The transistor MP2 in the control circuit 320 is in the off state, the first node Q1 at logic low level controls the transistor MN2 to be switched off, and the second node Q2 at logic high level controls the transistor MP6 to be switched off, so that the latch circuit 340 has no direct current path to generate a charging current to cause current conflicts, which allows the present invention to be applied under a low operating voltage system.

Figure 4:
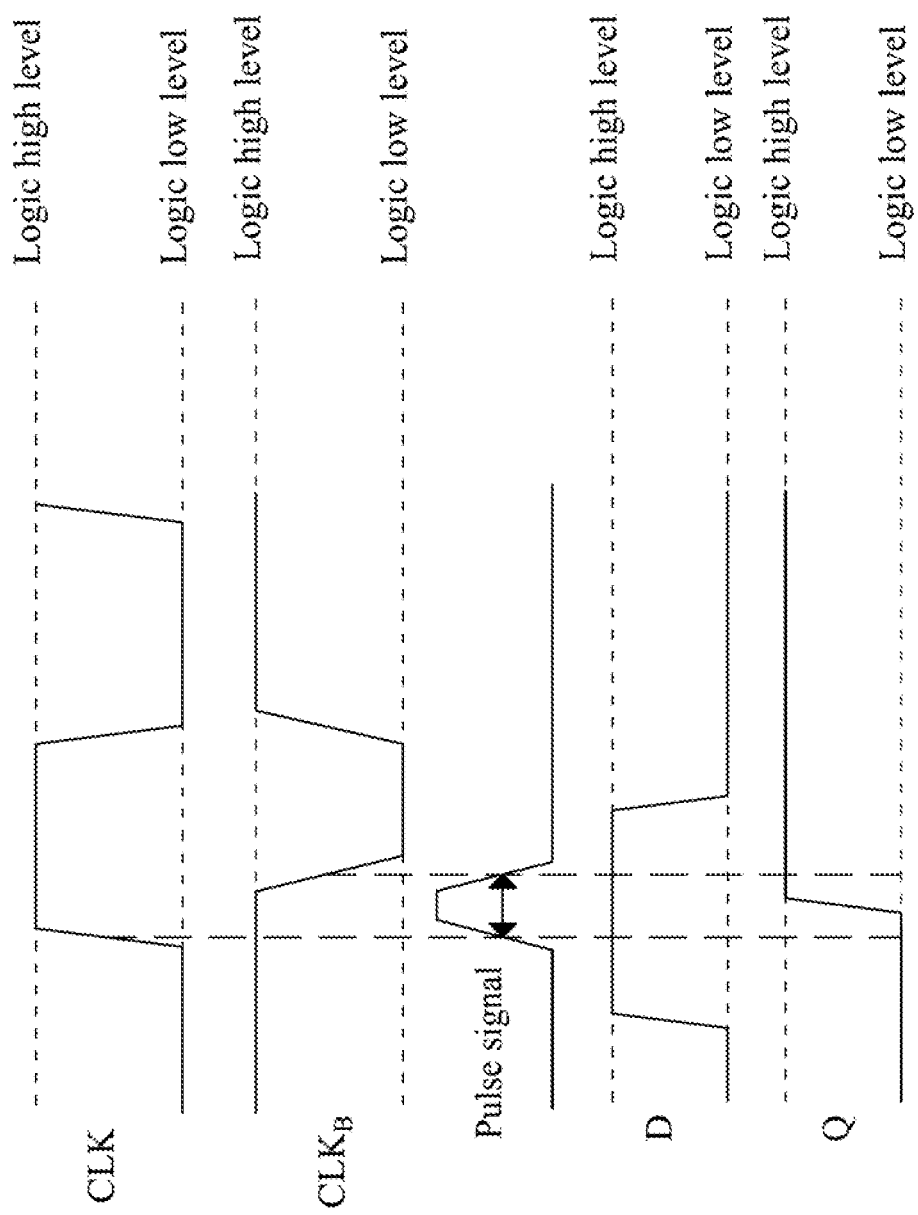
FIG. 4 illustrates a waveform diagram of a data output signal according to an embodiment of the present invention.

FIG. 4 illustrates a waveform diagram of a data output signal when the data input signal is at logic high level. According to FIG. 4, when the first clock signal CLK and the second clock signal CLKB are both at logic high level and the data input signal D is also at logic high level, the data output signal Q is raised from logic low level to logic high level and outputted from the output terminal of the fifth inverter 355 in FIG. 3 as illustrated in aforementioned descriptions.

Figure 5:
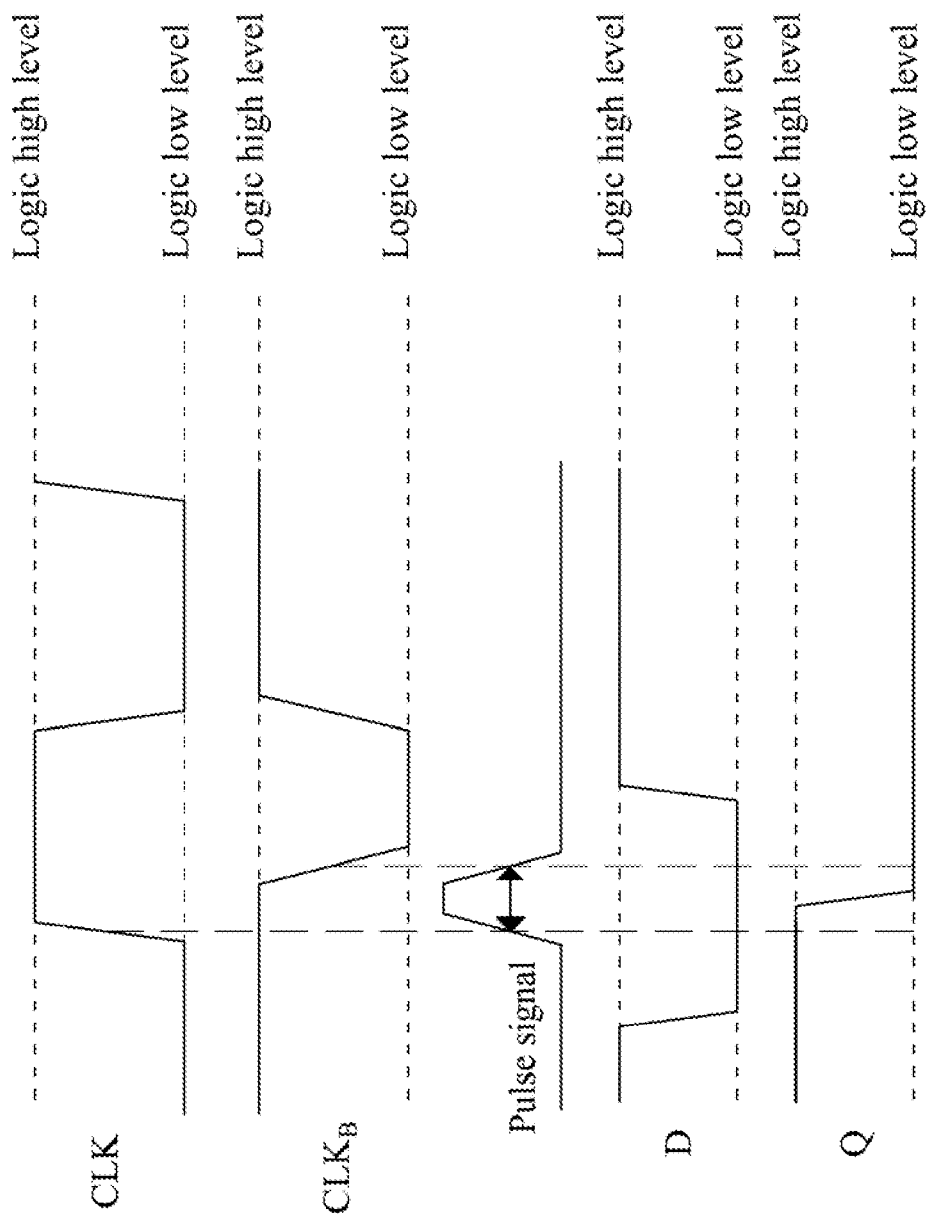
FIG. 5 illustrates a waveform diagram of a data output signal according to another embodiment of the present invention.

On the other hand, please refer to FIG. 3 and FIG. 5 at the same time for convenient illustration. When the first clock signal CLK and the second clock CLKB are both at logic high level and the data input signal D is at logic low level, the second switch element 370 in FIG. 3 is conductible, and the third switch element 375 is also controlled to be conductible by the inverted data input signal DB at logic high level. Since the second switch element 370 is conductible, the voltage level of the second node Q2 is at logic low level by which the gate of the transistor MP6 is controlled to be conductible.

With regarding to the control circuit 320, the transistor MP1, MP2, MP3 and MP4 are controlled by the inverted data input signal DB, the data input signal D, the first clock signal CLK and the second clock signal CLKB, respectively. Therefore, when the first clock signal CLK and the second clock signal CLKB are both at logic high level and the data input signal D is at logic low level, the transistor MP2 is conductible, and the transistor MP1, MP3 and MP4 are broken.

Please refer to FIG. 3, when the transistor MP2 and MP6 are controlled to switch on by the data input signal D and the second node Q1 respectively, the first node Q1 is transferred to logic high level due to the current path formed from the power supply potential VDD to the transistor MP2 and MP6, and thus switches the transistor MN2 on. Therefore, the transistor MP2, MP6 and MN2 are in the conducting state without any direct current from power supply potential VDD to the ground potential VSS. Currently the voltage level of the first node Q1 is at logic high level, so that it generates the data output signal Q at logic low level after being inverted by the fifth inverter 355.

The transistor MP1 in the control circuit 320 is in the off state, the second node Q2 at logic low level controls the transistor MN3 to be switched off, and the first node Q1 at logic high level controls the transistor MP5 to be switched off, so that the latch circuit 340 has no direct current path to generate a charging current to cause current conflicts, which allows the present invention to be applied under a low operating voltage system.

FIG. 5 illustrates a waveform chart of a data output signal when the data input signal is at logic low level. According to FIG. 5, when the first clock signal CLK and the second clock signal CLKB are both at logic high level and the data input signal D is at logic low level, the data output signal Q is transferred from logic high level to logic low level and outputted from the output terminal of the fifth inverter 355 in FIG. 3 as illustrated in the aforementioned description.

In summary, the present invention discloses a pulse-based flip flop which includes a pulse generator and a data latch. The pulse generator can be implemented by five transistors, which effectively reduces the cost and the area of the layout of the electronic circuit. The design of the control circuit in the data latch coordinated with the delivery circuit also cuts the path of the direct current, which effectively reduces the operating power consumption and power leakage, and can also be applied in systems with low operating voltages.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pulse-based flip flop for latching a data input signal in response to a first clock signal and a second clock signal to convert the data input signal to a data output signal, the pulse-based flip flop comprising:
   a pulse generator configured for receiving the first clock signal and generating the second clock signal, the pulse generator comprising:
      a first inverter configured for receiving the first clock signal and outputting the second signal;
      a signal delay circuit electrically connected to the first inverter, configured for receiving the second clock signal and delaying the second clock signal; and
   a data latch in response to the first clock signal and the second clock signal, configured for latching the data input signal and generating the data output signal, the data latch comprises:
      a delivery circuit configured for delivering the data input signal;
      a latch circuit electrically connected to the delivery circuit, configured for receiving and latching the data input signal, and also outputting the data output signal; and
      a control circuit electrically connected to the latch circuit, configured for providing voltage to control the on and off of the latch circuit, wherein the control circuit comprises:
         a first PMOS transistor, the gate of the first PMOS transistor being configured for receiving an inverted data input signal which is the inverse of the data input signal, and the source of the first PMOS transistor being electrically connected to a power supply potential;
         a second PMOS transistor, the gate of the PMOS transistor being configured for receiving the data input signal, and the source of the PMOS transistor being electrically connected to the power supply potential;
         a third PMOS transistor, the gate of the third PMOS transistor being configured for receiving the first clock signal, the source of the third PMOS transistor being electrically connected to the drain of the first PMOS transistor or the drain of the second PMOS transistor, and the drain of the third PMOS transistor being electrically connected to the drain of the second PMOS transistor or the drain of the first PMOS transistor; and
         a fourth PMOS transistor, the gate of the fourth PMOS transistor being configured for receiving the second clock signal, the source of the fourth PMOS transistor being electrically connected to the source of the third PMOS transistor, and the drain of the fourth PMOS transistor being electrically connected to the drain of the third PMOS transistor.

2. The pulse-based flip flop of claim 1, wherein the signal delay circuit comprises:
   a second inverter electrically connected to the first inverter, configured for receiving the second clock signal; and
   a first NMOS transistor, the gate of the first NMOS transistor being electrically connected to the output terminal of the second inverter, configured for delaying the second clock signal with the second inverter in concurrence.

3. The pulse-based flip flop of claim 2, wherein the phase of the second clock signal is the inverse of the phase of the first clock signal.

4. The pulse-based flip flop of claim 1, wherein the latch circuit comprises:
   a third inverter, the input terminal of the third inverter being electrically connected to a first node, and the output terminal of the third inverter being electrically connected to a second node; and
   a fourth inverter, the input terminal of the fourth inverter being electrically connected to the second node, and the output terminal of the fourth inverter being electrically connected to the first node.

5. The pulse-based flip flop of claim 4, wherein the third inverter comprises:
   a fifth NMOS transistor, series-connected to the first PMOS transistor and
   a second NMOS transistor, series-connected to the fifth PMOS transistor, the gate of the second NMOS transistor being electrically connected to the gate of the fifth PMOS transistor, and the source of the second NMOS transistor being connected to a ground potential.

6. The pulse-based flip flop of claim 5, wherein the fourth inverter comprises:
   a sixth PMOS transistor, series-connected to the second PMOS transistor; and
   a third NMOS transistor, series-connected to the sixth PMOS transistor, the gate of the third NMOS being electrically connected to the gate of the sixth PMOS transistor, and the source of the third NMOS transistor being connected to the ground potential.

7. The pulse-based flip flop of claim 6, wherein the latch circuit further comprises:
   a fifth inverter, the input terminal of the fifth inverter being electrically connected to the first node, and the output terminal of the fifth inverter being configured for outputting the data output signal.

8. The pulse-based flip flop of claim 7, wherein the delivery circuit comprises:
   a first switch element electrically connected to the first node, the first switch element being switched on when the first and the second clock signals are both at logic high level; and
   a sixth inverter, the input terminal of the sixth inverter being configured for receiving the data input signal, and the output terminal of the sixth inverter being electrically connected to the first switch element.

9. The pulse-based flip flop of claim 8, wherein, when the first and the second clock signals are both at logic high level and the data input signal is also at logic high level, the first switch element is conductible, and the first PMOS transistor, the fifth PMOS transistor and the third NMOS transistor are also in a conducting state.

10. The pulse-based flip flop of claim 7, wherein the delivery circuit further comprises:
    a second switch element, electrically connected to the second node, the second switch element being switched on when the first and the second clock signals are both at logic high level; and
    a third switch element, electrically coupled to the second switch element, the sixth inverter and the output terminal and the ground potential, and the third switch element being switched on when the data input signal is at logic low level.

11. The pulse-based flip flop of claim 10, wherein when the first and the second clock signal are both at logic high level and the data input signal are at logic low level, the second switch element and the third switch element are conductible, and the second PMOS transistor, the sixth PMOS transistor and the second NMOS transistor are also in the conducting state.

\* \* \* \* \*